United States Patent [19]

Beausoleil et al.

[11] Patent Number: 5,551,013
[45] Date of Patent: Aug. 27, 1996

[54] MULTIPROCESSOR FOR HARDWARE EMULATION

[75] Inventors: William F. Beausoleil, Hopewell Junction; Tak-Kwong Ng, Hyde Park; Harold R. Palmer, Poughkeepsie, all of N.Y.

[73] Assignee: International Business Machines Corporation, Armonk, N.Y.

[21] Appl. No.: 253,881

[22] Filed: Jun. 3, 1994

[51] Int. Cl.$^6$ .................................................... G06F 9/455
[52] U.S. Cl. ................... 395/500; 364/578; 364/927.81; 395/183.13
[58] Field of Search .................................. 364/200, 578; 395/500, 200, 900; 371/16.2, 25.1, 68.3

[56] References Cited

U.S. PATENT DOCUMENTS

| | | | |
|---|---|---|---|
| 4,306,286 | 12/1981 | Cocke et al. | 364/200 |
| 4,638,423 | 1/1987 | Ballard | 364/200 |
| 4,674,089 | 6/1987 | Poret et al. | 364/200 |
| 4,789,924 | 12/1988 | Fukata | 364/200 |
| 4,868,822 | 9/1989 | Scott et al. | 371/16.2 |
| 4,873,656 | 10/1989 | Catlin | 364/578 |
| 4,916,647 | 4/1990 | Catlin | 364/578 |
| 5,025,364 | 6/1991 | Zellmer | 364/200 |
| 5,036,473 | 7/1991 | Butts et al. | 364/489 |
| 5,088,033 | 2/1992 | Binkley et al. | 395/500 |
| 5,109,353 | 4/1992 | Sample et al. | 364/578 |
| 5,132,971 | 7/1992 | Oguma et al. | 371/16.2 |
| 5,329,470 | 7/1994 | Sample et al. | 364/578 |

OTHER PUBLICATIONS

"Quickturn Enterprise Emulation Systems", Quickturn, Inc. (Corporate Brochure).
Varghese et al., "An efficient logic emulation system", IEEE Trans VLSI Sys, vol. 1, No. 2, Jun '93, pp. 171–174.
Walters, "Reprogrammable Hardware Emulation for ASICs makes thorogh Design Verfication Practical", IEEE, 1989, pp. 484–486.
Walters, "Computer–Aided Prototyping for ASIC–Based Systems", IEEE Design and Test Computers, Jun. 1991, p. 4–10.

Primary Examiner—Kevin J. Teska
Assistant Examiner—Tyrone V. Walker
Attorney, Agent, or Firm—Bernard M. Goldman

[57] ABSTRACT

A software-driven multiprocessor emulation system comprising a plurality of emulation processors connected in parallel in a module. One or more modules of processors comprise an emulation system. An execution unit in each processor includes a table-lookup unit for emulating any type of logic gate function. A parallel bus connects an output of each processor to a multiplexor input with every other processor in a module. Each processor embeds a control store to store software logic-representing signals for controlling operations of each processor. Also a data store is embedded in each processor to receive data generated under control of the software signals in the control store. The parallel processors on each module have a module input and a module output from each processor. The plurality of modules have their module outputs inter-connected to module inputs of all other modules. A sequencer synchronously cycles the processors through mini-cycles on all modules. Logic software drives all of the processors in the emulation system to emulate a complex array of Boolean logic, which may be all of the logic gates in a complex logic semiconductor chip. Special control means associated with the embedded control store and the embedded data store in each of the processors enables them to emulate all or part of a memory array within a target logic entity being emulated by the multiprocessor emulation system. Each cycle of processing may control the emulation of a level of logic being verified by the emulation processor.

7 Claims, 11 Drawing Sheets

FIG.1

LEFT CONTROL WORD
(LOGIC OPERATION)

| NODE ADDRESS | PATH CONTROL | LATCH CONTROL | SOURCE CONTROL | MEMORY OPERATION |
|---|---|---|---|---|
| ↓6 | ↓3 | ↓4 | ↓3 | ↓1 |
| NAD | PC | LC | SRC | MOP=0 |

FIG.2A

RIGHT CONTROL WORD
(LOGIC OPERATION)

| SOURCE CONTROL | LOGIC FUNCTION | READ ADDRESS A | READ ADDRESS B | READ ADDRESS C |
|---|---|---|---|---|
| ↓3 | ↓8 | ↓7 | ↓7 | ↓7 |
| SRC | LFT | RAA | RAB | RAC |

MULTIPROCESSOR FOR HARDWARE EMULATION

BACKGROUND OF THE INVENTION

In the brief span of less than two decades, fabrication techniques for "very large scale integration" (VLSI) chips have matured from a laboratory curiosity to routine manufacturing. As integrated circuit densities advance toward incredible numbers, chip production tools and methods strain to keep pace. To be useful, a VLSI chip must be precisely designed, thoroughly tested, and flawlessly manufactured. Producing a piece of silicon that is the size of a fingernail and contains millions of working transistors with millions of flawless interconnections is a daunting task. Doing so on the very first pass might seem impossible, but it is a realistic goal to which this invention is directed.

In today's competitive marketplace, companies must produce complex customized products quickly. The need to reduce time to market has increased the popularity of customized application specific integrated circuits (ASICs). Because it is an essential part of a new product, an ASIC chip must be developed quickly and designed right the first time, or the product may fail in the marketplace for lack of timeliness. What is needed is a fast path from initial design to a verified working ASIC chip. This invention can greatly shorten the design time for a new ASIC chip.

The complexity and miniature size of ASICs place unique demands on their development tools and processes. As a result, mechanical and printed circuit board (PCB) designers must work closely with ASIC designers to reduce the time to market. Although PCBs and ASICs may have a short useful lifespan, e.g., two years, ASICs often require two or more years to design, which is four to six times longer than most PCBs. Furthermore, large ASICs often exceed the memory and CPU capacity of PCB and other design tools. Simulating millions of gates of an ASIC logic design often exceed PCB simulation requirements. Finally, unlike PCB's, fabricated ASICs prototypes are not easily tested, measured, or altered.

To meet the demands imposed by ASIC designs, engineers need high-performance, large-capacity, accurate tools. Commonly called the "front-end process," the design creation, synthesis, and simulation enables the designer to develop a logical representation of their design. The "back-end process" of physical layout and verification assist designers with the physical representation of their designs. IC designers can choose from a variety of specific tools on the market for both categories.

It is axiomatic that a VLSI chip design must be verified, i.e., tested exhaustively against a reliable statement of its intended function, before it can be used. Without verification, the probability of combining hundreds of thousands of building blocks to obtain precisely the intended complex function is minuscule. Of course it is possible, given enough time and money, to cycle through the process of manufacturing prototypes of the chip and testing them in their intended environment until a working design is achieved. Chip foundry turnaround times have been reduced dramatically in recent years, however the cost, in both time and money, of manufacturing a prototype is still large and is likely to remain so.

Software simulation of a VLSI chip design is an alternative to prototyping. However, it is slow, tedious, and quite limited in capability. It is difficult, bordering on impossible, to check a VLSI chip design exhaustively by simulation due to the slowness of test execution and the difficulty and cost of generating and running a complete suite of test cases.

Increasing circuit densities of VLSI chips along with competitive pressures makes the prototyping and simulation approaches less desirable as the densities increase. Both approaches almost invariably require the iterative manufacturing of multiple prototype versions of a design to produce a fully functioning chip.

Emulators are much better choice for design verification than simulators, because an emulator can be used like a prototype and executes many times faster. An emulator uses the same input and output signals that would be used by a prototype, and may be substituted for a prototype in a real system. This is not possible with a simulator, where the input and output signals have to be synthesized and do not have the form of the real signals provided by an emulator or a prototype.

SUMMARY OF THE INVENTION

The subject invention helps to provide a fast path from initial design to a verified working ASIC chip at an affordable cost. It allows the designer to verify a chip design in a working environment using "real world" system components while the design is still "soft," never having been committed to silicon, etc. It provides VLSI chip emulation with unprecedented capacity, inter-connectivity, flexibility, efficiency and speed. I/O pin limitations of current VLSI chip emulators are overcome by using a path-per-cycle emulation technique coupled with unique interconnection facilities. The subject invention itself is embodied in VLSI technology and can emulate memory arrays and their software contents along with very large, fast logic circuits embodied in a VLSI chip design.

A basic building block of the subject invention is an emulation processor that emulates a large number, e.g., 128, of three-input logic gates. Each gate emulation can perform any of the 256 binary functions possible with 3-inputs and stores the results in a data stack for subsequent use. Conventional VLSI descriptions, such as a "50,000 gate array," are usually understood to refer to 2-input NAND gates. Analysis of various designs suggests that each three-input gate emulation with latched results of the subject invention is comparable to four 2-input NAND gates. Therefore, each emulation processor can emulate a design of significant complexity, i.e., comparable to five hundred 2-input NAND gates. Multiple, e.g., 64, emulation processors may be packaged in a single emulation chip (called a module in this document) and multiple, e.g., 65, emulation modules may be mounted on an emulation board. Each board may emulate up to one-half a million three-input gates, or about two million 2-input NAND gates. Of course, multiple emulation boards may be combined in an emulation engine, so many millions of logic gates may be emulated by an emulation engine of reasonable size.

Most ASIC chips are designed with register-to-register transfer logic where, during a single path clock cycle, signals propagate from register outputs through combinatorial logic and arrive at register inputs where they may be latched. The combinatorial logic consists of one or more gates, where each gate has one or more inputs and produces one or more outputs. A logic path includes all of the gates in the combinatorial logic through which signals pass to produce a specific input to a register.

Conventional emulators dedicate a processing element to emulating each specific gate in the combinatorial logic (see Reference, Quickturn, etc.). Because the invention preferably uses a fast technology, one emulation processor may be used to emulate an entire logic path. During emulation, a sequencer (one in each emulation module) is incremented from zero to a maximum value, producing a common step value sent to all emulation processors. An emulated path clock cycle begins when the sequencer is reset to zero, and ends when the maximum defined logic path length has been traversed. During the emulated path clock cycle, each emulation processor emulates all of the logic for a specific logic path (path-per-cycle).

The preferred embodiment of an emulation processor contains two embedded memory arrays—a control store, and a data stack, where each may have 128 entries. These arrays are addressed by the step value from the sequencer that is incremented after each emulation step. Each emulation processor uses the step value to access a control word that defines an operation to be performed during that step. Thus, a single logic element in each emulation processor may be used repetitively to perform the logic functions of up to 128 three-input gates, or about five hundred target system gates. Paths longer than 128 three-input gates are spread across multiple emulation processors. Emulation processor outputs may be latched within the emulation processor, providing global and local register capabilities.

The output produced by each emulation operation is stored within the emulation processor and is directly available to all of its successor operations. It is also available to all other emulation processors in the same emulation module through an inter-connection network. Additionally, an operation output may be latched as an emulation module output and be made available to one or more other emulation processors in other emulation module(s) on the same emulation board. Further, an emulation operation output may be latched as an external output, becoming an input to other emulation boards, the target system or an emulation support facility.

VLSI chips often are used to access data in some form of a memory array that may be embedded within the chip or external to it. The emulation processor emulates both types of memory arrays, and intertwines this memory array emulation flexibly with the logic function emulation described above. A bit in each control word may indicate a memory operation, causing several bits, e.g., 32, in a (right) control word to emulate memory array data. Special addressing facilities are used to access the emulated memory array data in the right control words during memory operations.

Right control words, e.g., 32 bits deep by 1 bit wide, used to emulate memory arrays can be flexibly combined to emulate single or multiple memory arrays with a very large variety of depths and widths. Any right control word used to emulate a memory array can also be accessed multiple times during an emulated path clock cycle to emulate a multi-ported memory array.

Logic function emulation operations and memory array emulation operations are flexibly combined among the emulation processors within an emulation engine, which may have a very large emulation capacity. Each emulation processor in the preferred embodiment has the potential to emulate up to 4,096 bits of memory array data (128×32). An emulation module has the potential to emulate up to one quarter of a million bits of memory array data. An emulation engine of moderate size can emulate several million bits of memory.

Before emulation can start, an emulation compiler is used to partition a logic design to be emulated into logical clusters. For each logical cluster, a control program consisting of a set of control words is constructed for a specific emulation processor. Individual emulation processor control programs are loaded into the embedded control stores of the emulation processors prior to emulation. During emulation, the emulation processors execute control words from their respective control programs in synchronism via step values provided by a common sequencer in each emulation module. During each step, an emulation processor executes a control word that corresponds to a single three-input logic gate in the logic path between registers of the emulated design. A complete sequence of steps corresponds to traversing all of the logic path in the combinatorial logic between register outputs and a specific register input. Each emulation processor executes its unique program to emulate its assigned logic cluster. It communicates with other emulation processor's in the same emulation module via an inter-connection network as required to combine the logic of the clusters in the emulated design. Communication with the target system, emulation support facilities, and emulation processors not in the same emulation module is provided by input and output signals on emulation module pads dedicated to each emulation processor.

During emulation, the sequencer increments through a programmed number of steps and may repeat, until halted by the emulation support facilities. Each revolution of the sequencer corresponds to a path clock cycle of the emulated design where the register outputs and target system inputs are logically combined and latched as register inputs for the next path clock cycle. The sequencer effectively divides the emulated path clock cycle into multiple, e.g., 128, steps where each step corresponds to the emulation of one three-input logic gate of the emulated design.

BRIEF DESCRIPTION OF TABLES (at end of specification)

Table 1 illustrates examples of logic function table encodings.

Table 2 describes allocation and scheduling for the example design.

Table 3 describes latching external bits out for the example design.

Table 4 describes loading memory address register bits for the example design.

Table 5 describes the memory operation for the example design.

Table 6 describes the emulation programs for the example design.

DETAILED DESCRIPTION OF THE PREFERRED EMBODIMENTS

EMULATION PROCESSOR

Figure 1:
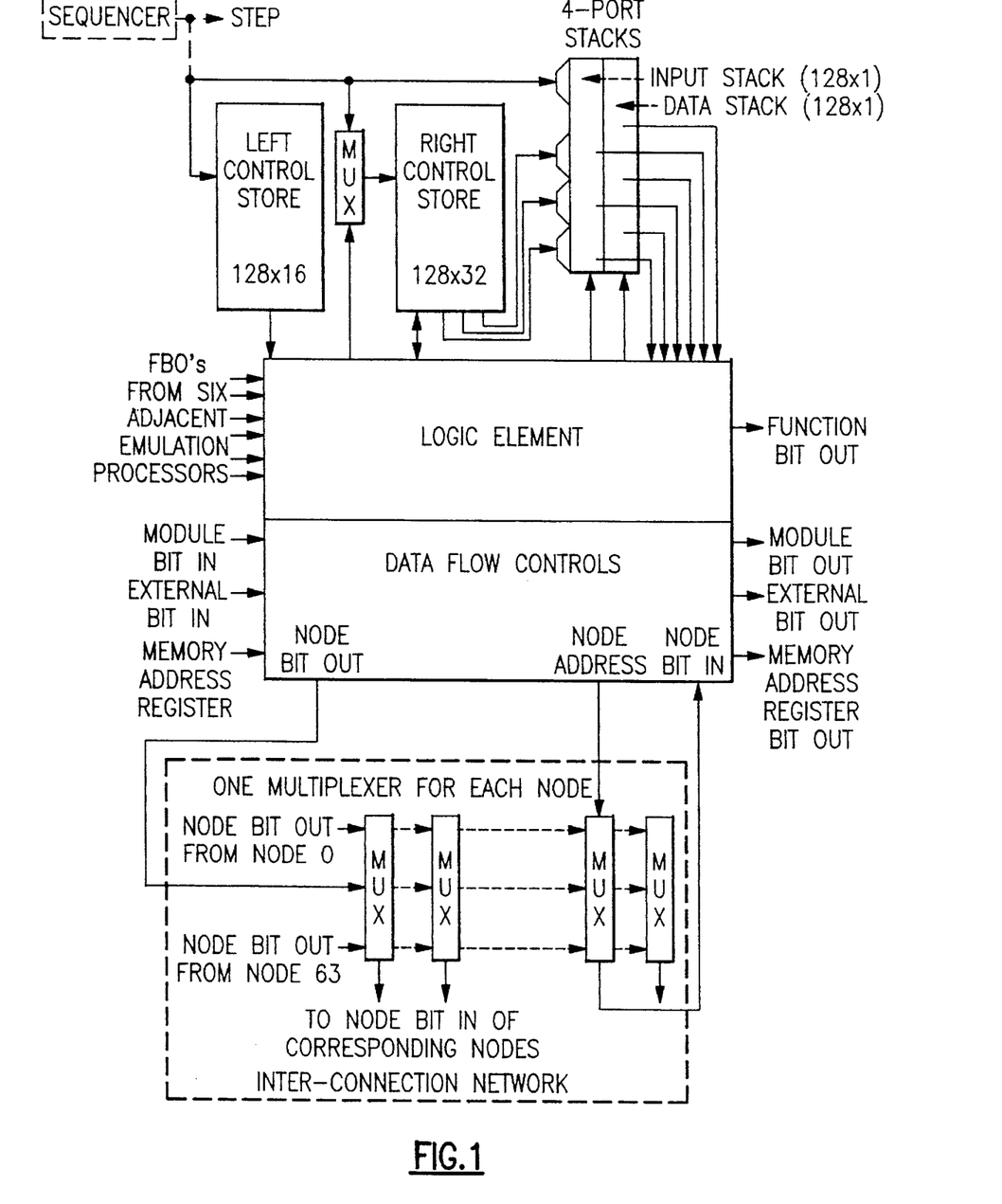
FIG. 1 is an overview of an emulation processor.
Figure 2A:
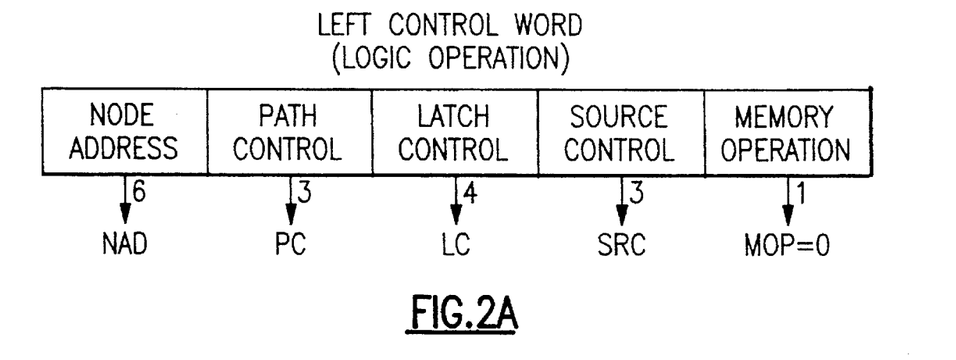
FIGS. 2A and 2B describe the control words fields used for emulating logic.
Figure 2B:
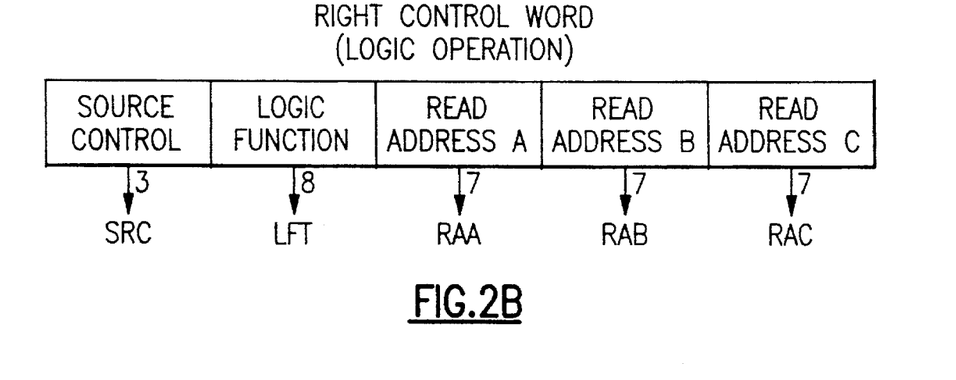

The emulation processor in FIG. 1, called a "processor" in this document is a fundamental component in the emulation engine of the preferred embodiment. The processor's primary function is to execute three-input logical function and produce a function bit out during each step of the sequencer. The inputs for each logic function can be selected from a variety of sources, including bits stored from a previous operation, or from another one or more processors. The resulting function bit out may correspond to any one of: a logic gate output of the emulated design, a register output of the emulated design, a synthesized intermediate logic state, or a control bit generated for the emulation process. An alternative to the processors' logic function is a memory operation where part of the control store is used to emulate a memory array in the logic design being emulated. Additional common operations performed by the processor during a sequencer step include storing the function bit out for subsequent use by the processor, capturing and storing external (to the processor) data, receiving data from another processor, and latching data for use by another processor, external data, or the MAR.

An emulation chip (called a module in this document) contains multiple, e.g., 64, processors. All processors within the module are identical and have the internal structure shown in FIG. 1. Details of the processor structure are presented in FIGS. 2 through 5. FIG. 1, a specified processor includes all but the "sequencer" and the "inter-connection network" (dotted boxes) which occur only once in a module. The left and right control stores hold a unique program created by an emulation compiler for a specified processor. The stacks hold data previously generated and are addressed by fields in a corresponding right control word to locate three binary bits for input to the logic element. The input stack holds data received via the node bit in (FIG. 5), and the data stack holds data previously generated by the processor (function bit out or memory bit out).

During each step of the sequencer, an emulation processor emulates either a three input logic function, or a memory array access according to the emulation program. Selection of the logic or memory operation is dynamically determined by a bit in each of the left control words. The data flow control interprets the current control word to route and latch data within the processor.

Figure 5:
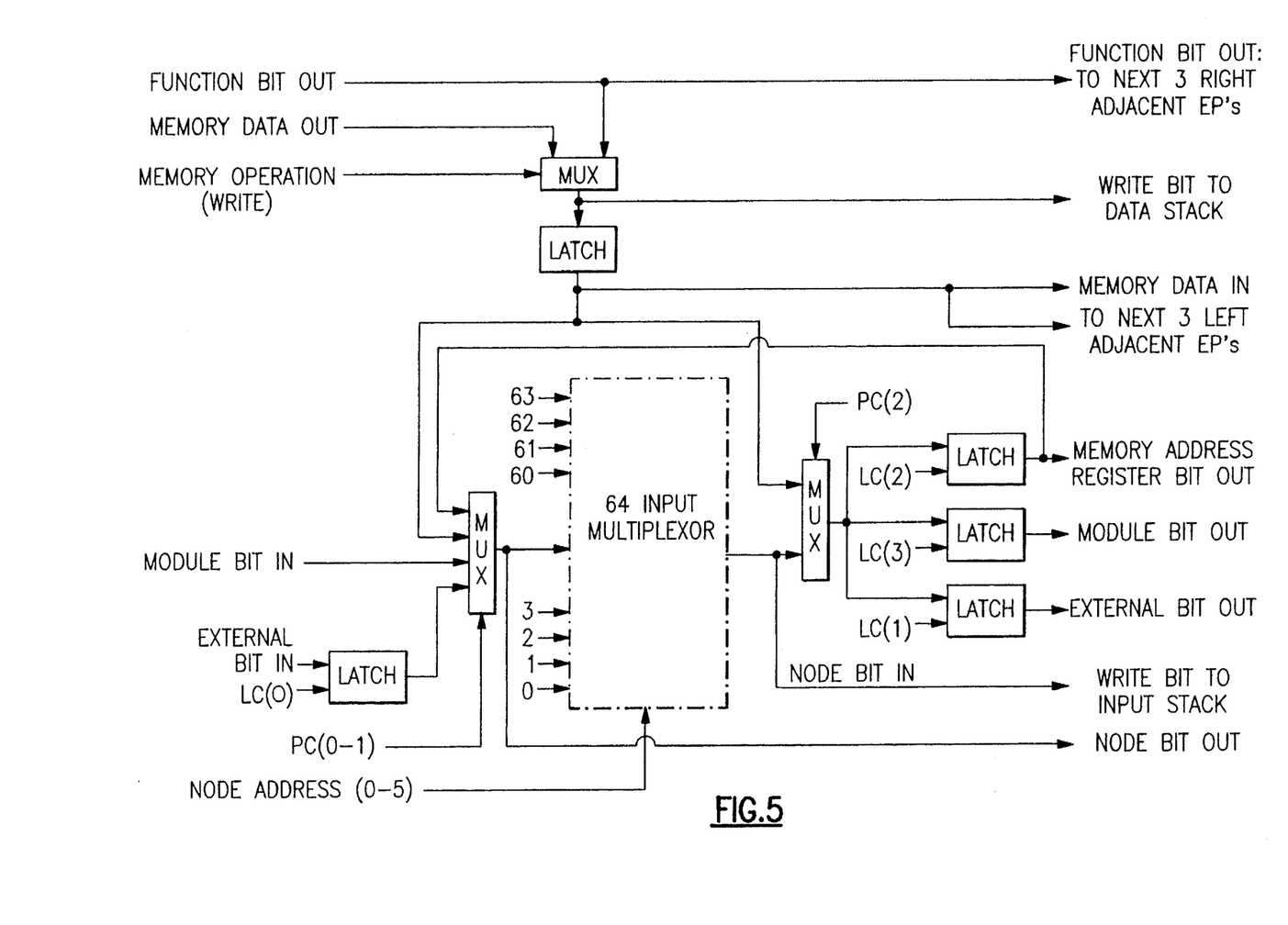
FIG. 5 describes the internal data flow of an emulation processor.

The node bit out signal from a specified processor is presented to the inter-connection network (FIG. 1) where it is distributed to each of the sixty-four 64 input multiplexers. The node address field in the left control word allows a specified processor to select for its node bit in signal, the node bit out signal from any of the 64 processors within the module. The node bit in is stored in the input stack on every step. During any logic or memory operation, the node bit out signal of a specified processor may be accessed by none, one, or all of the processors within the module.

Data routing within each processor's data flow and through the inter-connection network occurs independently of and overlaps the execution of the logic emulation function in each processor.

CONTROL STORE

Each control store in the preferred embodiment stores 128 control words executed sequentially and repetitively under control of the common sequencer in the associated module. Each revolution of the sequencer causes the step value to advance from zero to a predetermined maximum value and corresponds to one design path clock cycle for the emulated design. A left control word and a right control word in the control store are simultaneously selected during each step of the sequencer. A multi-signal bus is referenced in these figures uses a notation where for example, PC(0-1) references the first and second signals of the PC bus, and LC(2) references the third signal of the LC bus.

A logic function emulation operation is defined by a left and right control word pair when a memory operation bit in the left control word is inactive (off). A memory operation is defined by a left control word when the memory operation bit in it is active (on). For the memory operation, the right control store is not directly addressed by the step value, but instead is addressed by a combination of data from the left control word and a memory address register. Contents of the addressed right control word during a memory operation are interpreted as data in the emulated memory array. Accordingly, any of the right control words may be addressed during any sequencer step, and only the left control words are sequentially addressed by the step signal from the module sequencer.

FIGS. 2A and 2B and FIGS. 3A and 3B describe the control word fields used by the processor when it emulates a logic function or memory array operation respectively. It should be noted that the fields in the left and right control words are redefined with the exception of the node address and the path control bits which remain active when the memory operation bit (MOP) is active. The collective control word fields are:

Node address (NAD): Six bits presented from the processor to the inter-connection network that causes the associated 64-input multiplexer to select a node bit out from one of sixty-four processors in the module. The selected node bit out is received as a node bit in signal and is stored in the input stack and during logic operations may be stored in one or more of the latches in the processor.

Path control (PC): Three bits that control the flow of data within the processor and primarily determines which data is to be presented as node bit out (see FIG. 5).

Latch control (LC): (MOP=0) Four bits that independently control the setting of four latches in the processor data flow during logic operations only (see FIG. 5).

Source control (SRC): (MOP=0) Six bits that select the three sources of data for input to the logic element for emulating a logic function (see FIG. 4).

Figure 3A:
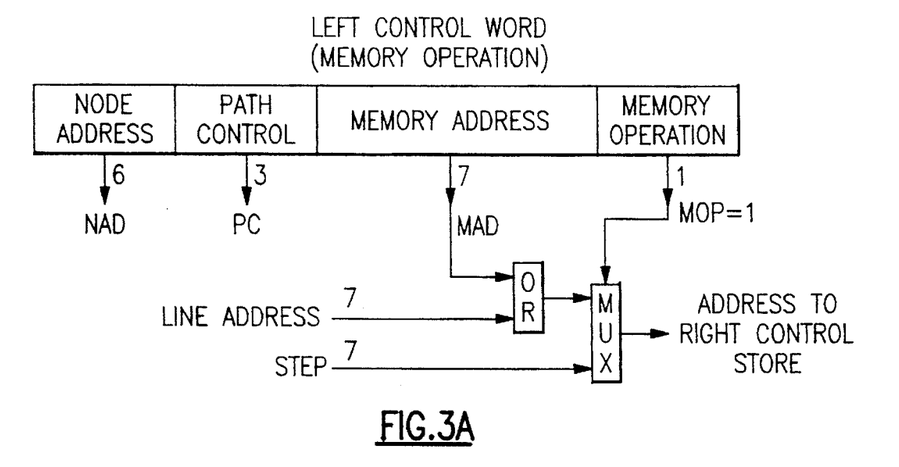
FIGS. 3A and 3B describe the control words fields used for emulating memory.
Figure 3B:
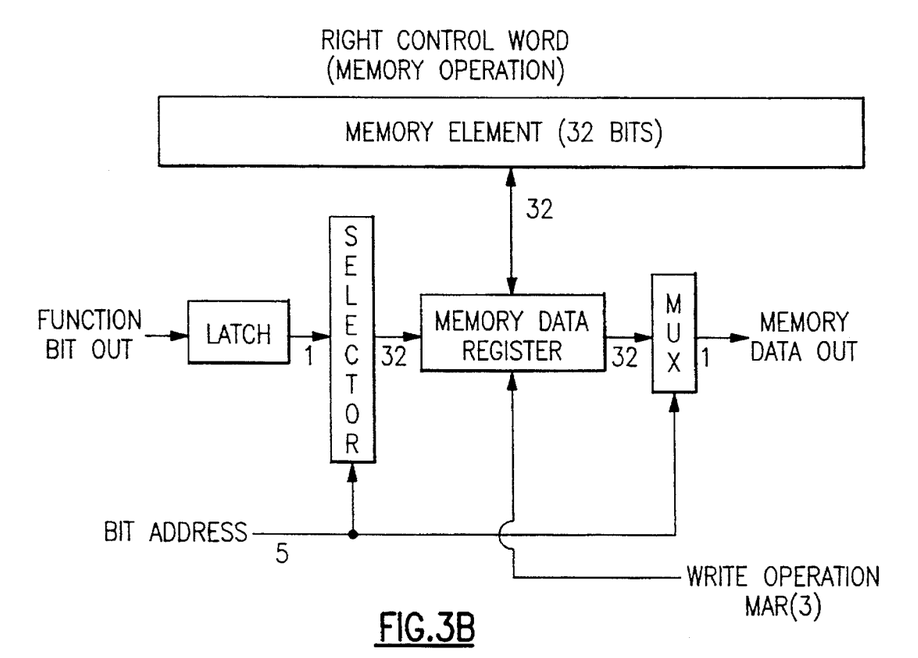

Memory operation (MOP): A single bit that determines whether a logic function emulation function or a memory array access operation is to be executed during the current step. When the MOP bit is inactive, the right control store is accessed by the step value. When the MOP bit is active, the right control store is accessed by the logical "OR"ing of the memory address field in the left control word and the line address from the memory address register (see FIG. 3).

Logic function table (LFT): (MOP=0) Eight bits that define the logic function to be emulated. The logic function is emulated by forming an address from three data bits and extracting one of the eight bits.

Read address A (RAA): (MOP=0) Seven bits that address both stacks to select a data bit that may be used as address bit 0 of the logic function emulation in the logic element (see FIG. 4).

Read address B (RAB): (MOP=0) Seven bits that address both stacks to select a data bit that may be used as address bit 1 of the logic function emulation in the logic element (see FIG. 4).

Read address C (RAC): (MOP=0) Seven bits that address both stacks to select a data bit that may be used as address bit 2 of the logic function emulation in the logic element (see FIG. 4).

Memory Address (MAD): (MOP=0) Seven bits that may be logically ORed with the line address from the memory address register to access a control word in the right control store during the emulation of a memory array access operation.

STACKS

Each processor in the module has two 128 by 1 bit multi-ported stacks for local data storage, where each stack has one write and three read addresses. The write address is derived from the step value and is used to store data into both stacks on every step. The three read addresses (RAA, RAB, and RAC) are used during a logic function emulation operation to selectively access data previously stored. The data read may be used by the logic element to build an address for accessing a single bit from the logic function (LFT) in the right control word.

The data stack holds data generated internally by the specified processor (function bit out or memory bit out). The input stack holds data acquired external to the processor, and selected by the processor data flow (see FIG. 5). Generally, this data comes from another processor, emulation support facilities, or the external target system.

LOGIC ELEMENT

A logic function to be emulated by the logic element of the processor is encoded as an eight bit logic function table. Three data bits are used to construct an index for the table, and the bit addressed represents the results, or output, of the logic function. For example, a three-input NAND function can be encoded as '11111110'b. Only when all three address bits are high does the accessed bit become inactive, i.e., NAND. Similarly, a three-input OR function can be encoded as '01111111'b, where the accessed bit is inactive only when all address bits are inactive. A simple inverter can be encoded as '10101010'b where the bit accessed is the inverse of the least significant address bit. With an eight bit logic function table, any of the 256 logic functions can be specified.

Figure 4:
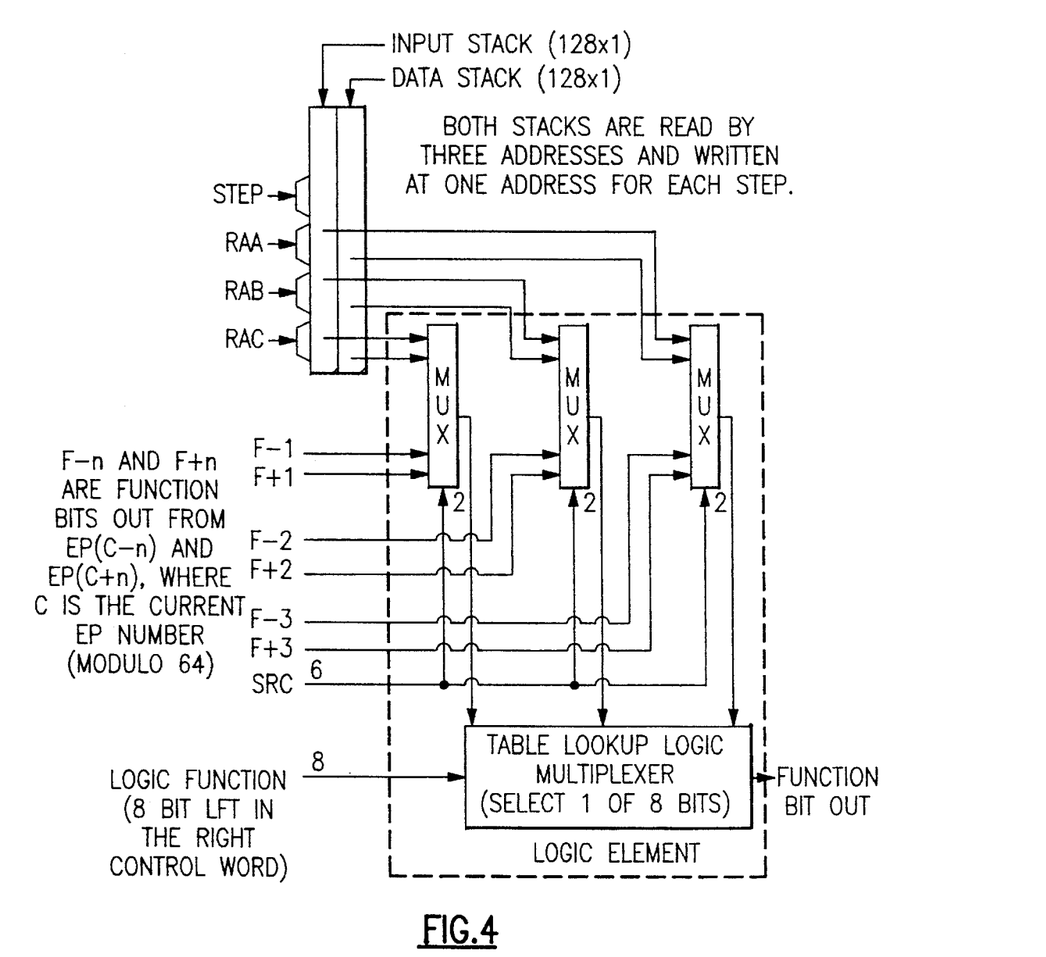
FIG. 4 describes the logic element used for emulating logic.

The logic element of the processor is shown in the dotted box in FIG. 4. Three 4-input multiplexers each select data from one of four sources to become an address bit. The three address bits are combined as the select inputs to the 8-input multiplexer. The data input to this multiplexer is from the 8 bit LFT field in the right control word. The bit selected from the LFT field is the result of the emulated function and presented as the function bit out signal.

The six bits of the source control (SRC) fields in the control store are functionally divided into three 2-bit sub-fields where each is used by an address multiplexer. "Simple" logic functions are emulated when data from the input stack and/or the data stack is used for the logic function index. An "expanded" logic function can also be executed when adjacent processors are programmed to cooperate during a given step. For an expanded logic function step, the function bit out of one or more (up to three in this embodiment) adjacent processors are used to form the logic function index. In FIG. 4, these expanded inputs are designated as F−n and F+n, where n=1, 2, or 3. In the embodiment, the F−n inputs are from the function bit out of the identified processors, and the F+n inputs are from latched function bit out values of the previous step. For example, a module with 64 processors can emulate a 129 bit input expanded logic function in one step.

With the logic element, the contents of the control words in the left and right control store correlate to emulating low level logic gates of the programmed design. Normally, a good design limits the number of logic gates in a logic path to minimize path delay and increase performance. Our analysis suggests that 128 control words are sufficient for emulating most designs. However, for a design that exceeds this limit, the expanded logic function can also be used to emulate a subset of low level logic gates in one step. The emulation compiler analyzes the low level logic gates of the design to be simulated and inserts expanded logic functions when appropriate.

DATA FLOW

The data flow in FIG. 5 shows the additional internal latches and multiplexers that complete the logic of a single processor. This data flow routes data within the processor and contains latches for holding data to be used external to the processor and module. Also shown in FIG. 5 is the corresponding 64-input multiplexer of the inter-connection network (FIG. 1) that selects data from another processor for the node bit in signal.

The path control field PC from the current left control word routes data within the data flow to select the data sources for node bit out and data to be written in the data stack. The latch control field LC independently controls the latching of data in the four respective latches for later use.

Figure 7:
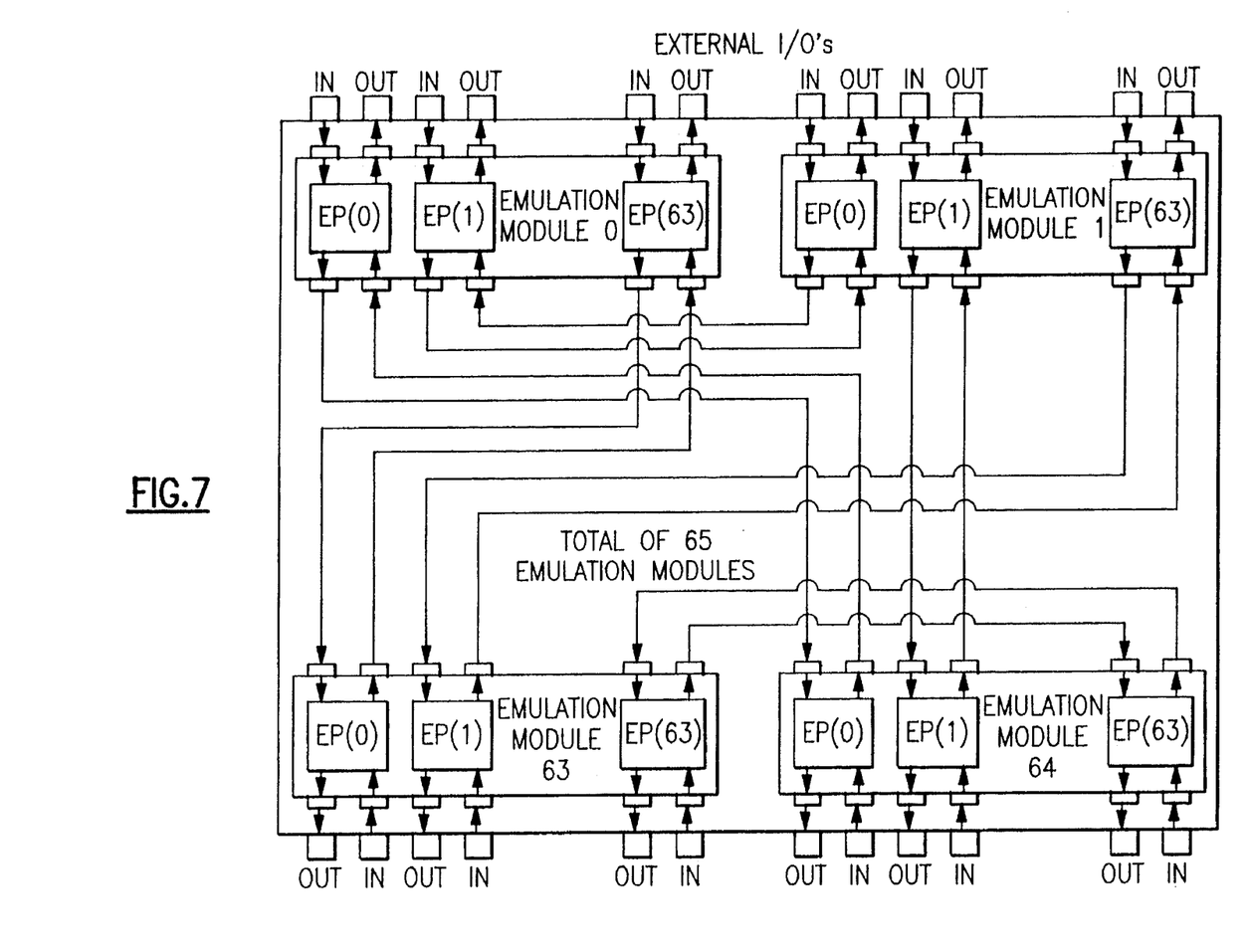
FIG. 7 is an overview of an emulation board.
Figure 8:
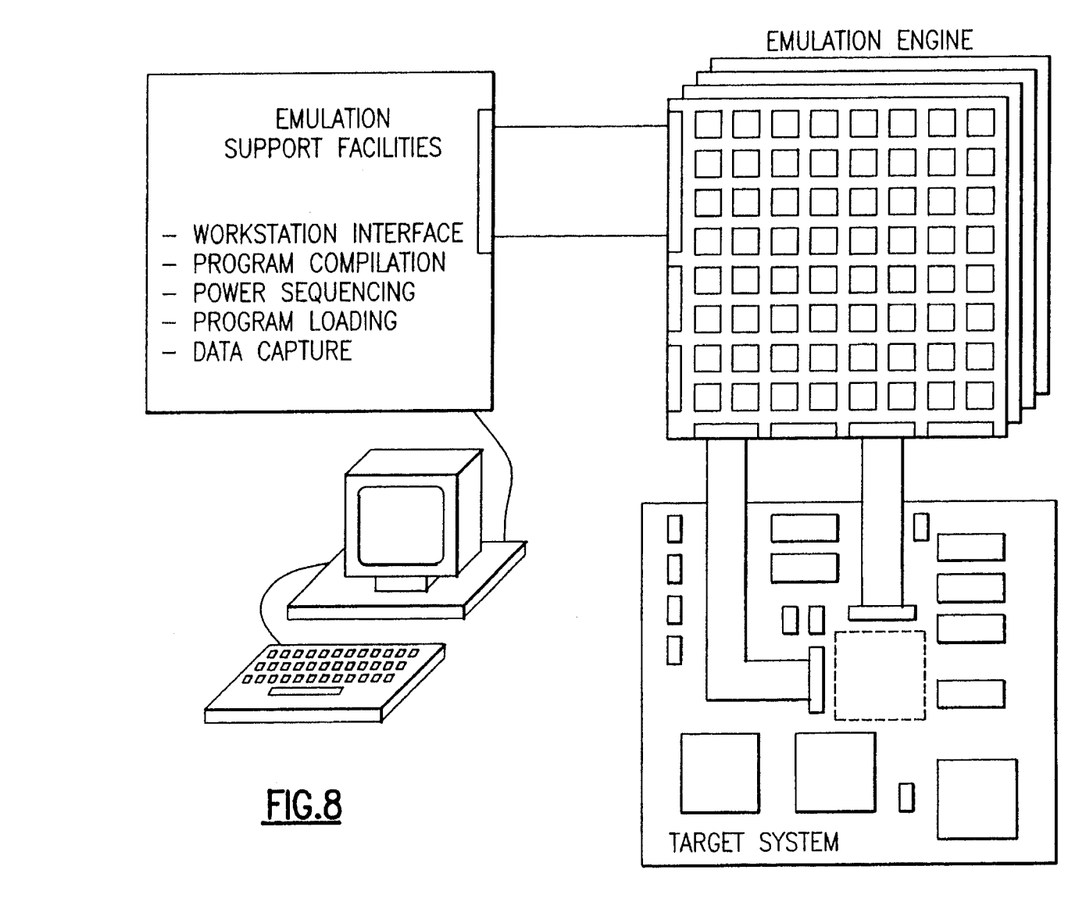
FIG. 8 is an overview of an emulation system.

The module bit in and module bit out latches are used by the processor to communicate with a specified processor in another module on the same emulation board (FIG. 7). These two signals are connected to dedicated module pins and wired to specific matching pins on another module on the same emulation board. Data bits transferred on these pins is time multiplexed in that it can change from step to step and may correspond to several nodes in the design being emulated.

The external bit in and external bit out latches are used by the processor to communicate with emulation support facilities, the target system, or processors on other emulation boards. These two signals are also connected to dedicated module pins and wired to connector pins on the emulation board. Normally information on these pins changes at most once during a revolution of the sequencer and corresponds to an input or output signal of the emulated design. When connected to emulation support facilities, the data bits may change from step to step.

An important feature of this data flow is the ability to execute a logic operation (saving the results) concurrently with passing module bit in data to the inter-connection network. This bypass routing feature augments the inter-module board level wiring where specific processors are inter-connected. It provides non-blocking inter-processor communication in two steps when the processors are not in the same module and not directly connected via emulation board wiring.

MEMORY ADDRESS REGISTER

To augment emulated memory array operations, the emulation module contains multiple, e.g., four, memory address registers. Each register is composed of three fields: a line address of 7 bits, a bit address of 5 bits, and a read/write operation bit. During a memory operation (FIGS. 3A and 3B), the line address is ORed with the memory address data (MAD) from the left control word to form an address that is applied to the right control store to access the embedded memory element. The bit address is used to select a single bit for the memory read or write operation.

Conceptually, the memory address register is independent of the processors in a module, however, physically, each memory address register is composed of the memory address bit latches (FIG. 5) in thirteen processors. Four independent memory address registers can be configured on a module with 64 processors, where each is associated with a quadrant of 16 processors. The emulation control programs in the associated processors cooperate to the build and alter the contents of the shared memory address register. The 12 (3 from each quadrant) remaining (spare) memory address bit latches in each emulation module can be used for other purposes during a logic operation.

EMULATION MODULE

Figure 6:
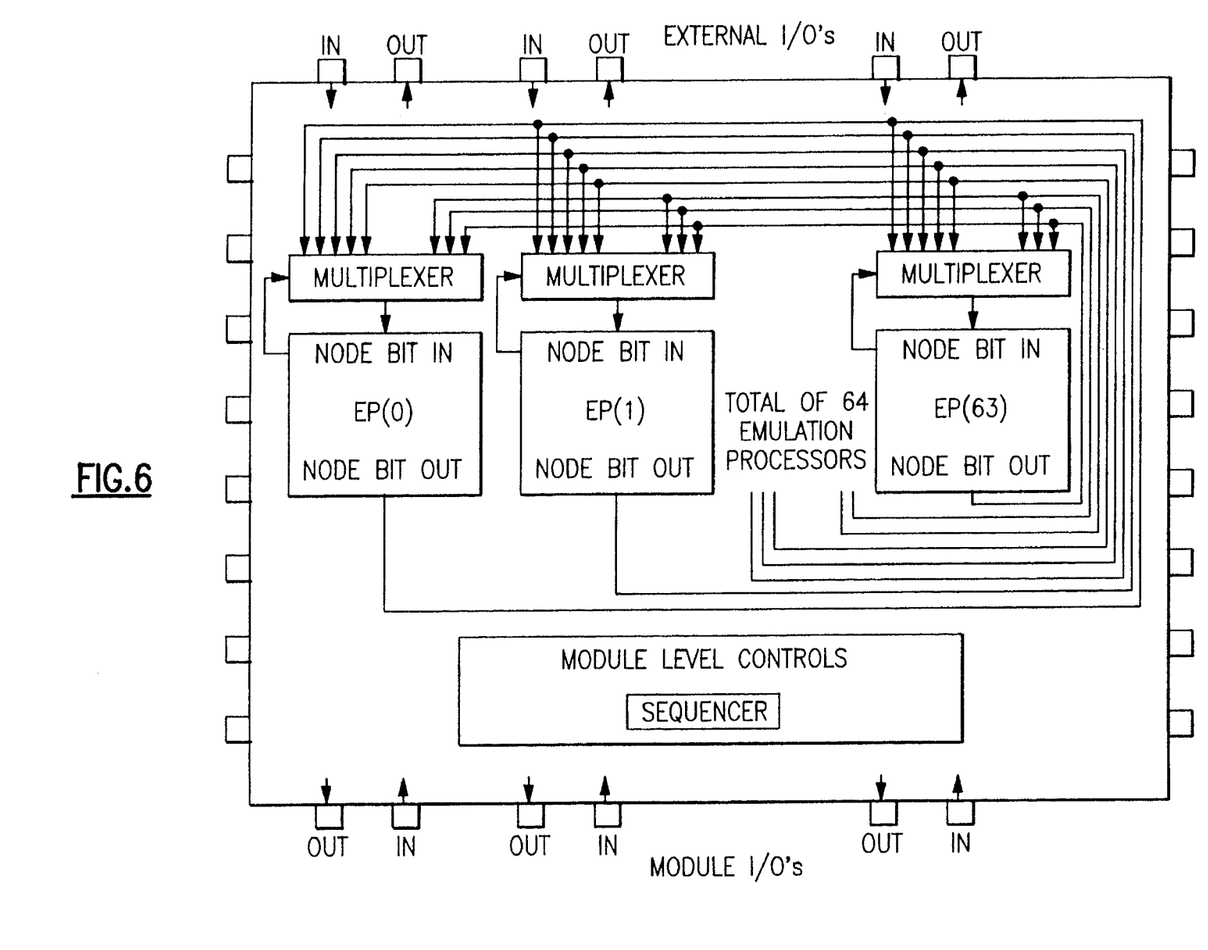
FIG. 6 is an overview of an emulation module.

The emulation processor previously described is a fundamental component of the emulation engine. The emulation module shown in FIG. 6 is the first level of physical packaging and contains an array of 64 identical processors, an inter-connection network, and a sequencer. The step value from the sequencer is provided to all of the processors in the module causing them to execute their emulation programs in synchronism. During emulation, the sequencer repeatedly increments from 0 to a maximum value. The maximum value (less than 128) depends on the maximum path length of the emulated design. When multiple modules are used to emulate a design, their sequencers step synchronously and contain the same value.

Within a module, each processor is considered a node. The 64 nodes are inter-connected through the non-blocking inter-connection network consisting of sixty-four 64-input multiplexers. Each multiplexer is associated with a processor node. Each multiplexer receives a node address from its associated processor and returns a node bit in signal. Every multiplexer in the inter-connection network has as its input the node bit out signals from each of the 64 processors. Output of the multiplexer then becomes the node bit in to that processor. Thus, each multiplexer selects for input to its associated processor, the node bit out signal of any other processor in the module.

The data bits transferred to the inter-connection network for a given processor can change from step to step and are not dedicated to a specific net of an emulated design. The data from a processor to the inter-connection network on any specified step may represent an emulated gate output, an emulated register or memory output, or inter-processor emulation control information. The node bit in value is stored in the input stack of a processor for subsequent use and effects a very high fan-in. A very high fan-out, or broadcast is accomplished when several processors select (as their node bit in) the node bit out of the same processor.

Each processor is electrically connected to a set of four module pads for transferring data bits with devices other than the processors in the same module. Most module input and output pads are wired to other specific modules output and input pads on an emulation board (FIG. 7). A few module input and output pads are wired to emulation board connector pins. As with the inter-connection network, data bits on the module I/O pads can change from step to step.

External input and output module pads are internally connected to the external bit in and external bit out signals of the associated processor. These pads are normally used to communicate with other emulation boards or other facilities in the emulation system. Processors are thus assigned to specific emulation support facilities or I/O signals of the target system. Data on external I/O pads can change from step to step. However, when attached to the target system, it normally changes at most once during a revolution of the sequencer (design clock cycle).

EMULATION BOARD

At the next higher level of physical packaging, the emulation board shown in FIG. 7 contains an array of 65 identical emulation modules. These modules are interconnected by their module I/O pins such that each module has a specific input and output signal pair to every other module on the emulation board. These signal pairs interconnect module/processor pairs such that processor X in module Y is connected to processor Y in module X, except where X=Y. The 65th emulation module is connected to the unused pair (X=Y) of each of the other 64 emulation modules. Many alternative emulation board configurations are possible with more or fewer modules and fewer or more signal pairs between modules.

External I/O pins from each module are connected to emulation board I/O connector pins for communicating with other cards, emulation support facilities, and the target environment. Spare module I/O's (where X=Y above) can also be used for additional these external signals. An emulation board with 64 modules can have 4160 input pins (4096 external+64 spare module) and 4160 output pins for connecting to its environment and/or other cards.

EMULATION ENGINE

At the next higher level of physical packaging, several emulation boards of equal of different complexity can be interconnected to provide an emulation engine of significant capacity. Such an engine may be configured to emulate a design of several million gates. A single emulation engine may be programmed to emulate a single design or multiple designs simultaneously. When emulating a single design, every sequencer in every module will contain the same value and step synchronously. The sequencer stepping can also be synchronized with clocks in the target system. When multiple designs are emulated concurrently, only those sequencers operating for a specified design need to be stepped synchronously.

The design(s) may be "executed" on the emulation engine several times under greatly varying test conditions. Design errors can be easily corrected by making changes to the emulation program control words or by re-compiling the modified design. Because the emulation engine has high performance and runs at speeds compatible with the target system, the emulated design can be fully verified.

When a design has been fully developed, the emulation engine could become the permanent embodiment of the design. Additional support facilities would be required to load the emulation processors and control the emulation process.

EMULATION SYSTEM

An emulation system is composed of an emulation engine, the target system, and supporting facilities. Typically the supporting facilities include a control console, an emulation control processor (e.g., personal computer), emulation monitoring and data capturing facilities.

Selected emulation board connector pins on the emulation board(s) comprising the emulation engine are connected through signal interfacing circuits and connectors on a one-for-one basis to the signal pins of the target system. Thus, each input or output signal of the target system is connected to a specified emulation processor output or input signal. Similarly, emulation processors may be connected to the monitoring and data capturing facilities.

EMULATION COMPILER

An emulation compiler translates a user's logic design into a sequence of control words (CWs) that can be loaded into the control stores of the emulation processors in an emulation engine. The compiler reads data files describing the user's design and creates a set of emulation program files to control the emulation processors during emulation.

The compiler processes three input files that describe the users design in terms of cells and their inter-connections, where each cell is either a logic gate, a register, or a memory array:

Design file: This file describes the internal functions of the user's design. It contains multiple cell statements where each statement identifies a specific cell, its logical or memory function, the names of its input signal(s), and the names of its output signal(s).

Control file: This file describes how the users design connects to its external (target) environment. It contains multiple I/O statements where each statement identifies a specific physical I/O pin, the name of the signal attached to that pin, the direction of data transfer, and its connection(s) to the target system.

Assignment file: An optional file that describes how the cells in the user's design are assigned to emulation processors. Statements in this file identify: the number of processors to be used, cells that can be moved from one processor to another, the cost of moving such a move, the maximum logic path length, and the names of the time phases. Optional statements identify: system input or output signals and their starting or ending program steps and the associated processor number. When this file is not provided by the user, the compiler creates one during the assignment phase.

After processing the input files, the compiler proceeds through four phases to prepare the emulation programs:

Sizing: If the number of system input or output signals is greater than the processor number in the control file, the compiler will increase that number to allow each processor to handle one input and/or output system signal.

Assignment: For all cells in the design, one or more processor(s) is assigned to one or more cell(s). The assignment goals are:

- Group cells with the same input and output signals within the same processor. Any signal passing from a cell in one processor to a cell in a different processor requires an additional step to transfer the signal.
- Assign an approximately equal number of cells to every processor to balance the emulation work load.

Path breaking: A path is defined in the compiler to begin at a system input signal or latching device (register or memory array), pass through zero or more logic gates, and end at a system output signal or latching device. A delay value is assigned to link in the path between interconnect gates:

1 for links between gates assigned to the same processor.

2 for links between gates assigned to different processors in the same module.

4 for links between gates assigned to processors in different modules.

The path length is calculated to be the sum of delay values for a given path. When the path length is greater than the value specified in the assignment file, it is divided by adding a register and adding a new time phase to the assignment file. The criterion for determining the path breakpoint is dependent on minimizing the emulation processing time.

Scheduling: During this phase, program files for each processor are created that specify what each processor is to do on each step. All processors have the same number of program steps and if no work is scheduled for a given step, the processor will be idle. The goal of this scheduling phase is to balance the workload by minimizing the maximum number of program steps. For an optimum solution, a gate should be emulated by every processor during every step.

EMULATION EXAMPLE

Figure 9A:
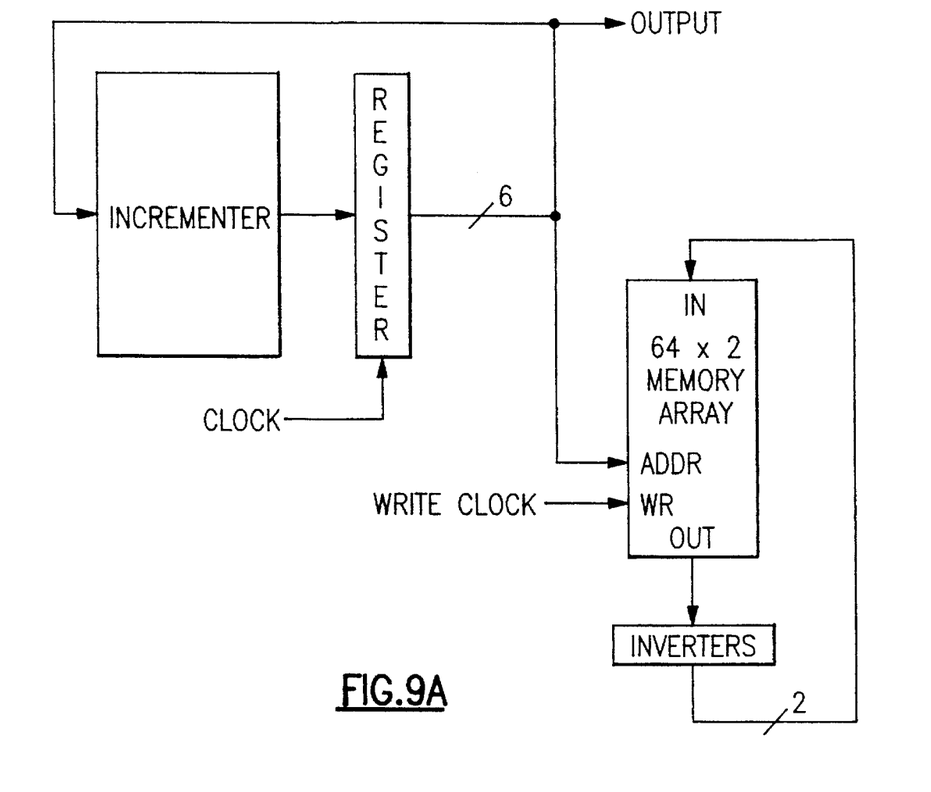
FIGS. 9A and 9B are an overview of an example design.
Figure 9B:
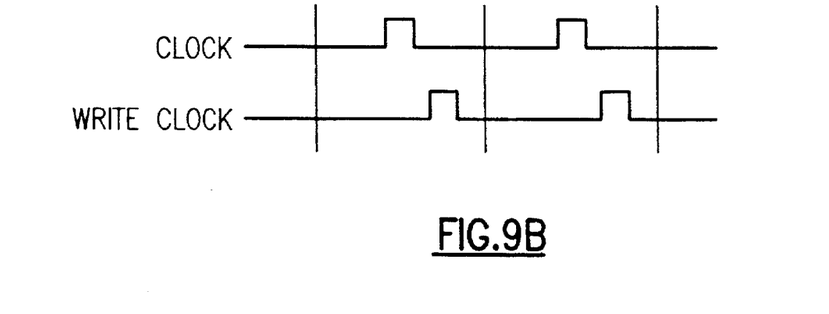
Figure 10:
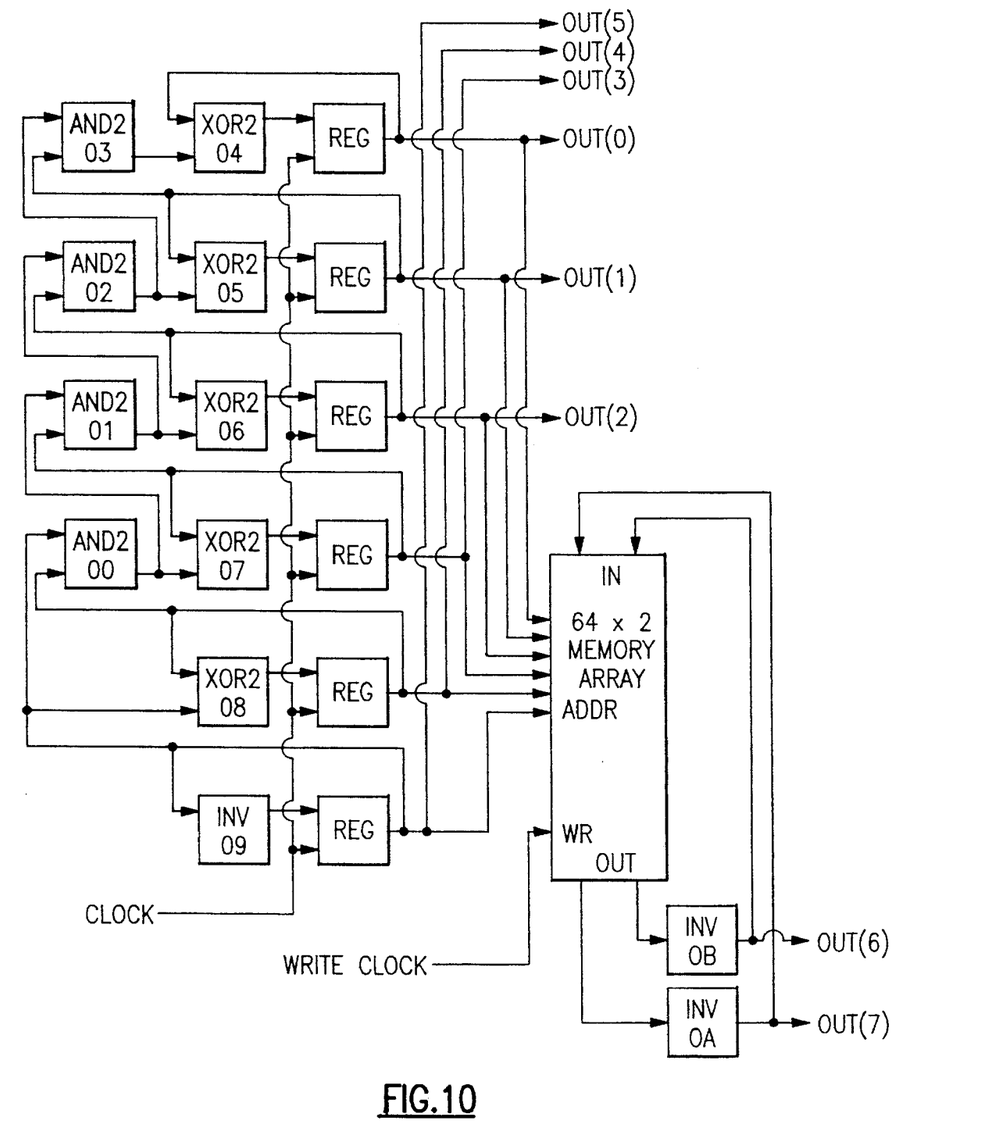
FIG. 10 is a detailed block diagram of the example design.
Figure 11A:
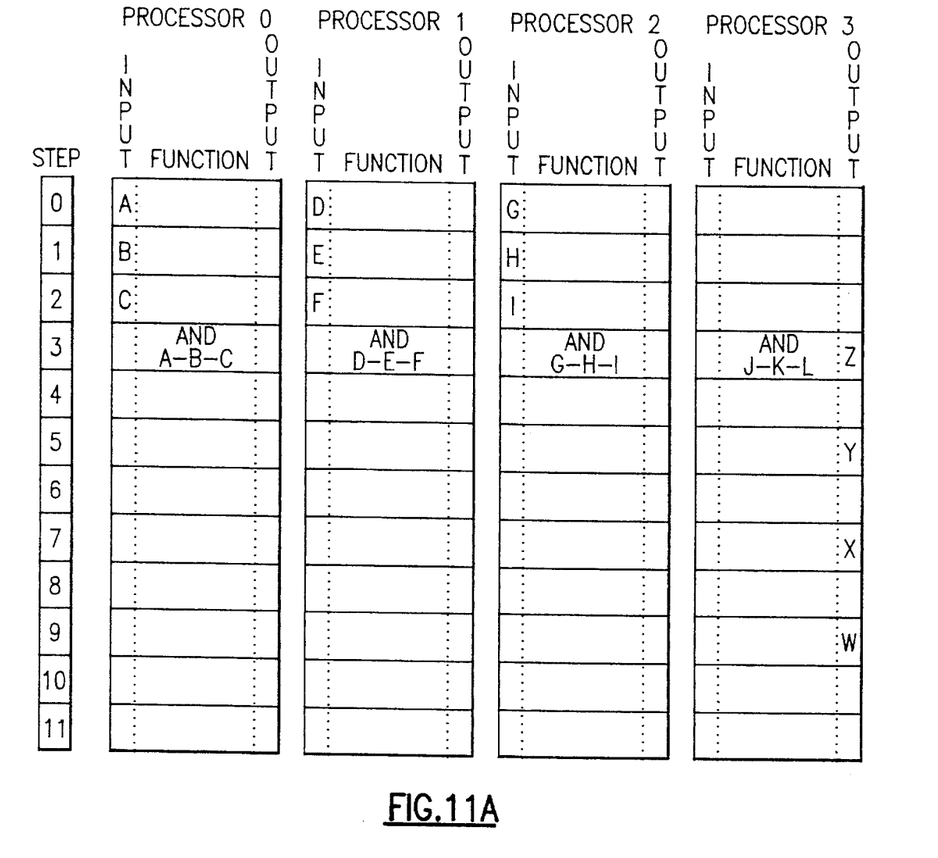
FIGS. 11A and 11B describe the assignments for the example design.
Figure 11B:
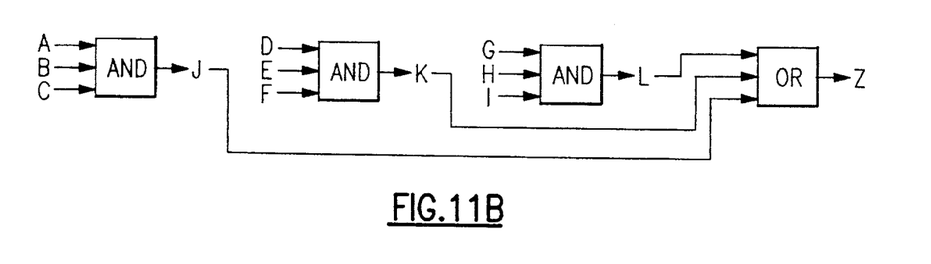

A hypothetical example is presented to demonstrate the processes of emulation compilation and the execution of emulation programs in the emulation engine. FIGS. 9A and 9B present an overview of the example where a six bit register provides an address to a memory array (64 words by 2 bits). Two bits are read from the memory, inverted, and written back to the same address on every design cycle. The contents of the register are also incremented on every design cycle. FIG. 10 describes the example in detail, i.e., at the gate level. Note that hexadecimal values are used in this example. FIGS. 11A and 11B describe the emulation processor assignments. Table 1 illustrates the logic function table encodings for a variety of logic functions. All values in the tables are in hexadecimal notation where for example, a hex 3B indicates a binary value of 00111011.

Tables 2 through 5 present intermediate compiler data that reflects the results of sizing, assignment and scheduling. For this simple example, no path breaking is required. Table 6 presents results of the compiler and the emulation programs for each of the fourteen emulation processors.

During the sizing and assignment phases, the compiler makes the following assignments:

Processors 00 through 05 are assigned to the six Out signals.

Processors 08 and 09 are assigned to emulate the 64 bit memory array.

Processors 0A through 0F are assigned to address the memory arrays.

From the resulting emulation programs, it can be seen that processor 04 emulates the incrementer, passing data to the respective processors used for the register output.

TABLE 1

Examples of Logic Function Table Encodings

| Logic Function | Binary Encoding | Hex Encoding | |
|---|---|---|---|
| AND3 | 00000001 | 01 | |
| AND2 | 00110011 | 33 | Third input ignored |
| XOR2 | 00111100 | 3C | |
| INV | 11110000 | F0 | First and second inputs ignored |
| MUX | 00001001 | 0B | Third input is selector |
| ONE | 11111111 | FF | |
| ZERO | 00000000 | 00 | |

TABLE 2

Allocation and Scheduling

| Gate Id | Function | FTB | Proc | Step |
|---|---|---|---|---|
| 00 | AND2 | 03 | 04 | 00 |
| 01 | AND2 | 03 | 04 | 01 |
| 02 | AND2 | 03 | 04 | 02 |
| 03 | AND2 | 03 | 04 | 03 |
| 04 | XOR2 | 3C | 04 | 04 |
| 05 | XOR2 | 3C | 04 | 05 |
| 06 | XOR2 | 3C | 04 | 06 |
| 07 | XOR2 | 3C | 04 | 07 |
| 08 | XOR2 | 3C | 04 | 08 |
| 09 | INV | F0 | 04 | 09 |
| 0A | INV | F0 | 08 | 0B |
| 0B | INV | F0 | 09 | 0B |

TABLE 3

Latching External Bit Out

| Proc | Step | Data Source | Signal |
|---|---|---|---|
| 00 | 04 | Processor 04 FBO | Out(0) |
| 01 | 05 | Processor 04 FBO | Out(1) |
| 02 | 06 | Processor 04 FBO | Out(2) |
| 03 | 07 | Processor 04 FBO | Out(3) |
| 04 | 08 | Processor 04 FBO | Out(4) |
| 05 | 09 | Processor 04 FBO | Out(5) |

TABLE 4

Load Memory Address Register bits

| Proc | Step | Data Source |
|---|---|---|
| 03 | 00 | Logic 0 Constant |
| 03 | 0B | Logic 1 Constant |
| 0A | 04 | Processor 04 FBO |
| 0B | 05 | Processor 04 FBO |
| 0C | 06 | Processor 04 FBO |
| 0D | 07 | Processor 04 FBO |
| 0E | 08 | Processor 04 FBO |
| 0F | 09 | Processor 04 FBO |

TABLE 5

Memory Operation

| Proc | MAD | Proc | Step | R/W |
|---|---|---|---|---|
| 08 | 10 | 08 | 0A | Read |
|    |    | 08 | 0C | Write |
| 09 | 10 | 09 | 0A | Read |
|    |    | 09 | 0C | Write |

TABLE 6

Emulation Programs for the Example

| Proc | Step | NAD | PC | LC | SRC | MOP | FTB | RAA | RAB | RAC |
|---|---|---|---|---|---|---|---|---|---|---|
| 00 | 04 | 04 | 3 | 4 | 2 2 2 | 0 | 00 | 00 | 00 | 00 |
| 01 | 05 | 04 | 3 | 4 | 2 2 2 | 0 | 00 | 00 | 00 | 00 |
| 02 | 06 | 04 | 3 | 4 | 2 2 2 | 0 | 00 | 00 | 00 | 00 |
| 03 | 00 | 00 | 3 | 2 | 2 2 2 | 1 | 00 | 00 | 00 | 00 |
| 03 | 07 | 04 | 3 | 4 | 2 2 2 | 0 | 00 | 00 | 00 | 00 |
| 03 | 0B | 00 | 3 | 2 | 2 2 2 | 1 | FF | 00 | 00 | 00 |
| 04 | 00 | 00 | 3 | 0 | 2 2 2 | 0 | 03 | 09 | 08 | 00 |
| 04 | 01 | 00 | 3 | 0 | 2 2 2 | 0 | 03 | 00 | 07 | 00 |
| 04 | 02 | 00 | 3 | 0 | 2 2 2 | 0 | 03 | 01 | 06 | 00 |
| 04 | 03 | 00 | 3 | 0 | 2 2 2 | 0 | 03 | 02 | 05 | 00 |
| 04 | 04 | 00 | 3 | 0 | 2 2 2 | 0 | 3C | 03 | 04 | 00 |
| 04 | 05 | 00 | 3 | 0 | 2 2 2 | 0 | 3C | 02 | 05 | 00 |
| 04 | 06 | 00 | 3 | 0 | 2 2 2 | 0 | 3C | 01 | 06 | 00 |
| 04 | 07 | 00 | 3 | 0 | 2 2 2 | 0 | 3C | 00 | 07 | 00 |
| 04 | 08 | 00 | 3 | 4 | 2 2 2 | 0 | 3C | 08 | 09 | 00 |
| 04 | 09 | 00 | 3 | 0 | 2 2 2 | 0 | F0 | 09 | 00 | 00 |
| 05 | 09 | 04 | 3 | 4 | 2 2 2 | 0 | 00 | 00 | 00 | 00 |
| 08 | 0A | 00 | 0 | 2 | 0 0 0 | 1 | 00 | 00 | 00 | 00 |
| 08 | 0B | 00 | 0 | 0 | 2 2 2 | 0 | F0 | 0A | 00 | 00 |
| 08 | 0C | 00 | 0 | 2 | 0 0 0 | 1 | 00 | 00 | 00 | 00 |
| 09 | 0A | 00 | 0 | 2 | 0 0 0 | 1 | 00 | 00 | 00 | 00 |
| 09 | 0B | 00 | 0 | 0 | 2 2 2 | 0 | F0 | 0A | 00 | 00 |
| 09 | 0C | 00 | 0 | 2 | 0 0 0 | 1 | 00 | 00 | 00 | 00 |
| 0A | 04 | 04 | 3 | 2 | 2 2 2 | 0 | 00 | 00 | 00 | 00 |
| 0B | 05 | 04 | 3 | 2 | 2 2 2 | 0 | 00 | 00 | 00 | 00 |
| 0C | 06 | 04 | 3 | 2 | 2 2 2 | 0 | 00 | 00 | 00 | 00 |
| 0D | 07 | 04 | 3 | 2 | 2 2 2 | 0 | 00 | 00 | 00 | 00 |
| 0E | 08 | 04 | 3 | 2 | 2 2 2 | 0 | 00 | 00 | 00 | 00 |
| 0F | 09 | 04 | 3 | 2 | 2 2 2 | 0 | 00 | 00 | 00 | 00 |

Having thus described our invention, what we claim as new and desire to secure by Letters Patent is:

1. A software-driven multiprocessor emulation system, comprising a plurality of emulation processors, each emulation processor containing an execution unit for processing multiple types of logic gate functions, each emulation processor rapidly switching from one logic gate function to a next logic gate function in a switched-emulation sequence of different gate functions, and the switched-emulation sequence of each of the plurality of processors emulating a subset of gates in a hardware arrangement in which logic gates are of any type that the emulation processors functionally represent for a sequence of clock cycles, a plurality of multiplexors having outputs respectively connected to the emulation processors and having inputs respectively connected to each of the other emulation processors, and bus means connected to the multiplexors to enable an output from any emulation processor to be transferred to an input of any other of the emulation processors, an embedded control store in each of the emulation processors to store software logic-representing signals for controlling operations of the emulation processor, an embedded data store in each of the emulation processors to receive data generated by the same emulation processor under control of software signals stored in the embedded control store in the same emulation processor, and bus controls to transmit data on the bus means from any emulation processor through a connected multiplexor under control of software signals stored in the embedded control store to control computational emulation of the hardware arrangement by operation of the plurality of emulation processors under software control.

2. A software-driven multiprocessor emulation system as defined in claim 1, further comprising a table-lookup unit included in the execution unit of each emulation processor for computing operations of any of multiple types of logic gate functions.

3. A software-driven multiprocessor emulation system as defined in claim 1, further comprising a sequencer connected to the plurality of emulation processors and providing output cycling signals to the emulation processors to synchronize the operations of the emulation processors.

4. A software-driven multiprocessor emulation system as defined in claim 3, further comprising a single module unit containing the plurality of emulation processors, the bus means, the bus controls and the sequencer.

5. A software-driven multiprocessor emulation system as defined in claim 4, further comprising a plurality of module units, each module unit being constructed as defined in claim 4, each emulation processor on each module having one or more external inputs and one or more external outputs, intra-module bus means for connecting the external input and the external output of each emulation processor on each module to the external output and external input of a emulation processor on a different module to obtain an intra-module bus connection from each module to each other module in the emulation system, and means for synchronizing the sequencers on all of the modules for a cycle of execution by the multiprocessor emulation system.

6. A software-driven multiprocessor emulation system, comprising a plurality of emulation processors, each emulation processor containing an execution unit for processing multiple types of logic gate functions, each emulation processor rapidly switching from one logic gate function to a next logic gate function in a switched-emulation sequence of different gate functions, and the switched-emulation sequence of each of the plurality of processors emulating a subset of gates in a hardware arrangement in which logic gates are of any type that the emulation processors functionally represent for a sequence of clock cycles, a plurality of multiplexors having outputs respectively connected to the emulation processors and having inputs respectively connected to each of the other emulation processors, and bus means connected to the multiplexors to enable an output from any emulation processor to be transferred to inputs of the other emulation processors, an embedded control store in each of the emulation processors to store software logic-representing signals for controlling operations of the emulation processor, an embedded data store in each of the emulation processors to receive data generated by the same emulation processor under control of software signals stored in the embedded control store in the same emulation processor, and bus controls to transmit data on the bus means from any emulation processor through a connected multiplexor under control of software signals stored in the embedded control store to control computational emulation of the hardware arrangement by operation of the plurality of emulation processors under software control, a sequencer connected to the plurality of emulation processors and providing output cycling signals to the emulation processors to synchronize the operations of the emulation processors, a plurality of module units, each emulation processor on each module having an external input and an external output, intra-module bus means for connecting the external input and the external output of each emulation processor on each module to the external outputs and external inputs of emulation processors of a different module to obtain an intra-module bus connection from each module to each other module in the emulation system, means for synchronizing the sequencers on all of the modules for a cycle of execution by the multiprocessor emulation system, logic software stored in the system, the logic software previously compiled to contain logic software clusters representing subsets of logic functions for being emulated by the multiprocessor emulation system, loading means for loading different software clusters of the logic software into the embedded control stores of different emulation processors prior to an execution cycle by all of the emulation processors, initiating means for initiating the sequencer for an execution sequence for all of the emulation processors after software clusters are loaded into the emulation processors, and the loading means and the initiating means alternately and repetitively operating until all software clusters of the logic have been processed to complete an emulation operation.

7. A software-driven multiprocessor emulation system as defined in claim 1, further comprising special control means associated with the embedded control store and the embedded data store associated with each of the emulation processors to enable the embedded control store to operate with the embedded data store to emulate all or part of a memory array within a target logic entity being emulated by the multiprocessor emulation system.

* * * * *